(12) United States Patent
Chen et al.

(10) Patent No.: US 12,300,507 B2
(45) Date of Patent: *May 13, 2025

(54) METHOD OF MANUFACTURING A SEMICONDUCTOR DEVICE

(71) Applicant: Taiwan Semiconductor Manufacturing Company, Ltd., Hsinchu (TW)

(72) Inventors: Yen-Hao Chen, New Taipei (TW); Wei-Han Lai, New Taipei (TW); Ching-Yu Chang, Yuansun Village (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/438,047

(22) Filed: Feb. 9, 2024

(65) Prior Publication Data
US 2024/0186148 A1 Jun. 6, 2024

Related U.S. Application Data

(60) Continuation of application No. 18/132,868, filed on Apr. 10, 2023, now Pat. No. 11,935,757, which is a (Continued)

(51) Int. Cl.
*H01L 21/00* (2006.01)
*H01L 21/02* (2006.01)
(Continued)

(52) U.S. Cl.
CPC .. *H01L 21/32115* (2013.01); *H01L 21/02118* (2013.01); *H01L 21/02406* (2013.01);
(Continued)

(58) Field of Classification Search
CPC ........... H01L 21/02118; H01L 21/0276; H01L 21/31058; H01L 21/31051
See application file for complete search history.

(56) References Cited

U.S. PATENT DOCUMENTS 11,935,757 B2 * 3/2024 Chen ................. H01L 21/32115
2006/0089000 A1 4/2006 Della Guardia et al.
(Continued)

FOREIGN PATENT DOCUMENTS

CN 102265217 A 11/2011
CN 103311101 A 9/2013
(Continued)

OTHER PUBLICATIONS

Takanori Kudo et al., "Development of Spin-On-Carbon Hard Mask for Advanced Node," Advances in Patterning Materials and Processes XXXI, Proc. of SPIE vol. 9051, pp. 90511X-1 to 90511X-8 (2014).
(Continued)

*Primary Examiner* — Reema Patel
(74) *Attorney, Agent, or Firm* — STUDEBAKER BRACKETT PLLC

(57) ABSTRACT

A method of manufacturing a semiconductor device includes forming a first layer of a first planarizing material over a patterned surface of a substrate, forming a second layer of a second planarizing material over the first planarizing layer, crosslinking a portion of the first planarizing material and a portion of the second planarizing material, and removing a portion of the second planarizing material that is not crosslinked. In an embodiment, the method further includes forming a third layer of a third planarizing material over the second planarizing material after removing the portion of the second planarizing material that is not crosslinked. The third planarizing material can include a bottom anti-reflective coating or a spin-on carbon, and an acid or an acid generator.
(Continued)

The first planarizing material can include a spin-on carbon, and an acid, a thermal acid generator or a photoacid generator.

20 Claims, 7 Drawing Sheets

Related U.S. Application Data continuation of application No. 17/712,982, filed on Apr. 4, 2022, now Pat. No. 11,626,293, which is a division of application No. 16/697,988, filed on Nov. 27, 2019, now Pat. No. 11,295,961.

(51) Int. Cl.
  *H01L 21/027* (2006.01)
  *H01L 21/3105* (2006.01)
  *H01L 21/321* (2006.01)

(52) U.S. Cl.
  CPC .... *H01L 21/02557* (2013.01); *H01L 21/0276* (2013.01); *H01L 21/31058* (2013.01)

(56) References Cited

U.S. PATENT DOCUMENTS

| | | |
|---|---|---|
| 2010/0173247 A1 | 7/2010 | Burns et al. |
| 2013/0244434 A1 | 9/2013 | Lu et al. |
| 2015/0294878 A1 | 10/2015 | deVilliers |
| 2017/0115572 A1 | 4/2017 | Jeong et al. |
| 2019/0096686 A1 | 3/2019 | Hsu et al. |
| 2020/0335327 A1 | 10/2020 | Tiron et al. |

FOREIGN PATENT DOCUMENTS

| | | |
|---|---|---|
| KR | 10-2018-0079972 A | 7/2018 |
| TW | 201604932 A | 2/2016 |

OTHER PUBLICATIONS

Photoacid Generators, Millipore Sigma, Retrieved on Nov. 27, 2019 from https://www.sigmaaldrich.com/materials-science/material-science-products.html?TablePage=9542506.

Non-Final Office Action issued in U.S. Appl. No. 16/697,988, filed Aug. 18, 2021.

Notice of Allowance issued in U.S. Appl. No. 16/697,988, filed Dec. 1, 2021.

Notice of Allowance issued in U.S. Appl. No. 17/712,982, filed Dec. 7, 2022.

Notice of Allowance issued in U.S. Appl. No. 18/132,868, filed Nov. 8, 2023.

\* cited by examiner

METHOD OF MANUFACTURING A SEMICONDUCTOR DEVICE

RELATED APPLICATIONS

This application is a continuation of U.S. patent Ser. No. 18/132,868 filed Apr. 10, 2023, now U.S. Pat. No. 11,935,757, which is a continuation of U.S. patent application Ser. No. 17/712,982 filed Apr. 4, 2022, now U.S. Pat. No. 11,626,293, which is a division of U.S. patent application Ser. No. 16/697,988 filed Nov. 27, 2019, now U.S. Pat. No. 11,295,961, the entire content of each of which is incorporated herein by reference.

BACKGROUND

As electronic devices have gotten smaller and smaller in response to consumer demand, the individual components of these devices have necessarily decreased in size as well. Semiconductor devices, which make up a major component of devices, such as mobile phones, computer tablets, and the like, have been pressured to become smaller and smaller, with a corresponding pressure on the individual devices (e.g., transistors, resistors, capacitors, etc.) within the semiconductor devices to also be reduced in size.

As these devices decrease in dimensions, controlling variations in fabrication processes of the devices become more important. As devices shrink, the uniformity and planarity of some of the components become more challenging to control. These challenges relate, for example, to etch control of smaller patterned features, unintended substrate damages given smaller tolerances associated with reduced dimensions, and/or finer critical dimension drifts on defocused patterns, etc. Thus, uncontrolled non-planarity and/or non-uniformity during complex semiconductor and lithographic processes can lead to reduced productivity in the manufacturing of these devices and low reliability in the finished ones. Therefore, new approaches are urgently needed to improve planarity and/or uniformity problems in the next generation semiconductor processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
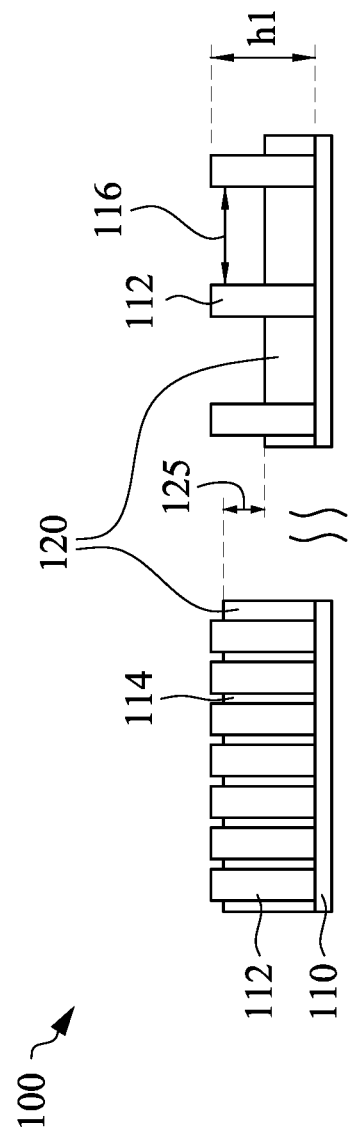
FIGS. 1A, 1B, 1C, 1D, 1E, and 1F illustrate a process flow for planarizing uneven underlayer structures, according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Although many approaches have been demonstrated to improve planarity via processes, such as chemical mechanical polishing or complex etching processes, they often result in prohibitive costs that are not suitable for mass manufacturing. A new approach that can improve planarity and/or uniformity issues in the next generation semiconductor processes, without prohibitive costs and/or integration penalty into existing process flows, includes using a multilayer coating of materials for enhancing etch selectivity and reflectivity control in device processing and fabrication. For example, materials, such as bottom anti-reflective coating (BARC) and spin-on carbon (SoC) materials are used to improve planarity. However, such materials may suffer from planarity or non-uniformity issues in various lithographic processes related to, for example, gap sizes in component patterns, for example, narrow gaps, wide gaps, or even substrates with different electrical, mechanical and chemical properties.

A non-planar or non-uniform spin-on carbon coating may result from forming the coating on patterned features having an area with narrow gaps and an area with wide gaps. Since the coating material in the areas are uneven and the etch rate of the coating being equal, the end result culminates in over-etching of the area with wide gaps when removing a proper amount of the coating material in the area with narrow gaps. The over-etching typically results in exposed patterned features that may become defective and result in failed devices. On the other hand, removing a proper amount of the coating material in the area with wide gaps would result in under-etching of the area with narrow gaps. The under-etching typically results in insufficient planarity, which affects subsequent lithography operations, and non-exposed patterned features that may result in non-functioning components and failed devices.

The process as disclosed herein includes application of a multilayer coating, which includes two or three layers of coatings and a solvent rinse operation. The application of multiple layers in the multilayer coating compensates topography bias to achieve planarity and uniformity of the multilayer coating on the patterned features. The coating material for the multilayer coating includes, but not limited to, spin-on carbon materials which can undergo crosslinking reaction by thermal activation, acid catalysis, and/or photo-illumination. The rinse material includes a solvent or co-solvent, which dissolves the non-crosslinked spin-on carbon materials. The spin-on carbon materials can include a cross-linker material or materials that undergo self-crosslinking.

As described herein, patterned features having narrow and wide gaps are used as examples to demonstrate the effectiveness of embodiments using a multilayer coating to improve planarity and/or uniformity issues that have been challenging to solve as the device dimensions continue to decrease. The present disclosure, however, is not limited to this process, the materials, and/or patterned features disclosed herein. The multilayer coating process and materials as disclosed herein can be used at any suitable time on any surface or substrate during the semiconductor device manufacturing process.

FIGS. 1A-1F illustrate a process flow for forming a multilayer spin-on carbon coating, according to an embodiment of the disclosure. FIG. 1A illustrates a component 100 disposed on a substrate 110 containing patterned features 112 having an area 114 with narrow gaps (also referred to herein as "narrow gap area 114") and an area 116 with wide gaps (also referred to herein as "wide gap area 116"). FIG. 1A also shows a first layer 120 that is spin-coated onto the patterned features 112 that result in uneven height of the first layer 120 in the narrow gap area 114 and the wide gap area 116. In some embodiments, the first layer 120 includes a first spin-on carbon material. As shown in FIG. 1A, the first layer 120 has a thickness that is less than a full height h1 of the patterned features 112 from an upper surface of the substrate 110 to the top of the patterned features 112, and the thickness is different in the area 114 and the area 116. The difference in the thickness of the first layer 120 in the two different areas 114 and 116 is illustrated as thickness difference 125, which shows the non-planarity or non-uniformity of single spin-on coatings when devices have areas of different pattern densities.

In some embodiments of the disclosure, the substrate 110 is a semiconductor substrate. In some embodiments, the substrate 110 includes a single crystalline semiconductor layer on at least its surface. In some embodiments, the substrate 110 includes a single crystalline semiconductor material such as, but not limited to, Si, Ge, SiGe, GaAs, InSb, GaP, GaSb, InAlAs, InGaAs, GaSbP, GaAsSb, and InP. In some embodiments, the substrate 110 is made of Si. In some embodiments, the substrate is a silicon wafer. In some embodiments, the substrate 110 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate.

In some embodiments, the patterned features 112 have a plurality of areas 114 with narrow gaps and a plurality of areas 116 with wide gaps. In some embodiments, the patterned features 112 may have a plurality of areas that have gaps with dimensions that fall between the narrow gaps and wide gaps. According to some embodiments as described herein, the narrow gaps have lateral dimensions between about 1 nm and about 5 nm, between about 1 nm and about 10 nm, between about 1 nm and about 15 nm, between about 1 nm and about 20 nm, between about 5 nm and about 25 nm, or between about 5 nm and about 50 nm, inclusive of any lateral dimensions therebetween. In some embodiments, the narrow gaps have lateral dimensions below about 5 nm, about 10 nm, about 15 nm, about 20 nm, about 25 nm, or about 50 nm. In some embodiments, the wide gaps have lateral dimensions between about 5 nm and about 50 nm, between about 10 nm and about 100 nm, between about 20 nm and about 200 nm, between about 20 nm and about 500 nm, between about 10 nm and about 250 nm, or between about 5 nm and about 500 nm, inclusive of any lateral dimensions therebetween. In some embodiments, the wide gaps have lateral dimensions larger than about 5 nm, about 10 nm, about 15 nm, about 20 nm, about 25 nm, or about 50 nm.

In some embodiments, the full height h1 of the patterned features 112 from the upper surface of the substrate 110 range from about 0.1 nm to about 5 mm. In some embodiments, the full height of the patterned features 112 ranges from about 0.5 nm to about 1 mm, about 1 nm to about 100 μm, about 1 nm to about 50 μm, about 5 nm to about 10 μm, about 10 nm to about 10 μm, or about 10 nm to about 1 μm, inclusive of any full height values therebetween.

In some embodiments, the patterned features 112 include transistors, including but not limited to, planar field-effect transistors (FET), fin FET (FinFET), metal-oxide-semiconductor FET (MOSFET), gate-all-around FET (GAAFET), wirings, or any other electronic devices, elements, or components.

In some embodiments, the thickness difference 125 in the two different areas 114 and 116 ranges from about 0.1 nm to about 1 mm. In some embodiments, the thickness difference 125 can range from about 0.2 nm to about 50 μm, about 0.3 nm to about 25 μm, about 0.4 nm to about 10 μm, about 0.5 nm to about 5 μm, about 1 nm to about 1 μm, or about 1 nm to about 100 μm, inclusive of any thickness difference values therebetween.

In some embodiments, the first layer 120 includes a first spin-on carbon material. In some embodiments, the first spin-on carbon material includes 2-phenylphenol, 1,4-divinylbenzene, diglyme, 9-anthracene methanol, and monomers, including but not limited to, 1-(9-anthrecenyl)-3-phenyl-2-propyn-1-ol (Monomer A), 1-(7H-benz[de]anthracen-7-yl)-3-phenyl-2-propyn-1-ol (Monomer B), 1-(5H-dibenzo[a,d]cyclohept-5-yl)-3-phenyl-2-propyn-1-ol (Monomer C) and 1-(1-pyrenyl)-3-phenyl-2-propyn-1-ol (Monomer D). The structures of the Monomers A, B, C, and D are shown below:

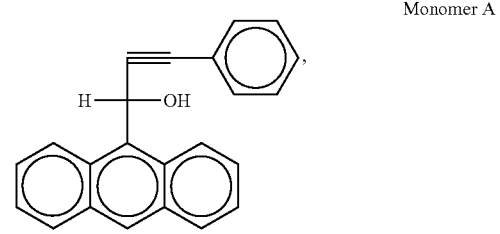

Monomer A

Monomer B

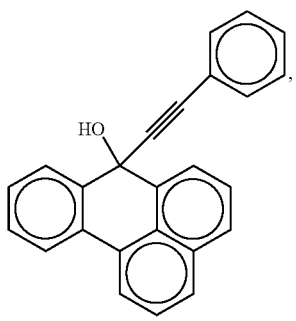

Monomer C

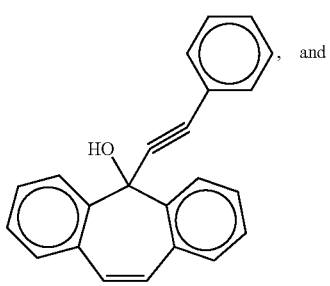, and

Monomer D

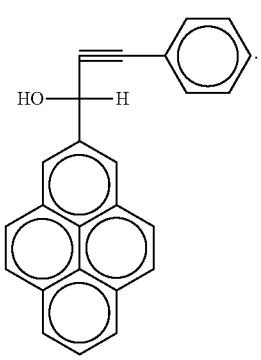

In some embodiments, the first spin-on carbon material includes a thermal acid generator (TAG), photoacid generator (PAG), or acid with a pH of less than 7. In some embodiments, the first spin-on carbon material includes up to about 30% by weight, about 25% by weight, about 20% by weight, about 15% by weight, about 10% by weight, about 5% by weight, or about 1% by weight of the thermal acid generator. In some embodiments, the first spin-on carbon material includes up to about 30% by weight, about 25% by weight, about 20% by weight, about 15% by weight, about 10% by weight, about 5% by weight, or about 1% by weight of the photoacid generator.

In some embodiments, the thermal acid generator includes a compound having a formula $CF_3-R-CF_2SO_3^{31}$ $(R^1)_4N^+$, where R is a straight chain or a cyclic alkyl, alkoxyl or fluoro chain having 1 to 6 carbons, or a cyclic alkene, alkyne, hydroxyl, ketone, aldehyde, carbonate, carboxylic acid, or aryl, and $R^1$ is hydrogen, an alkyl, a bond, or a ring with N. In some embodiments, the thermal acid generator material includes, but not limited to,

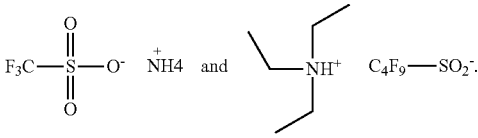

In some embodiments, the first spin-on carbon material includes one or more crosslinker materials. In some embodiments, the first spin-on carbon material includes one or more crosslinker materials up to about 30% by weight, about 25% by weight, about 20% by weight, about 15% by weight, about 10% by weight, about 5% by weight, or about 1% by weight. In some embodiments, the crosslinker material is

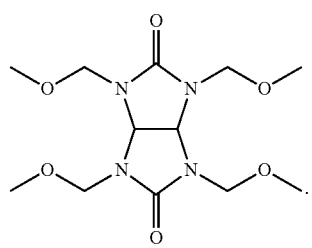

In some embodiments, the crosslinker material has the following structure:

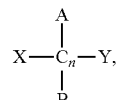

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C.

In some embodiments, the crosslinker material includes the following:

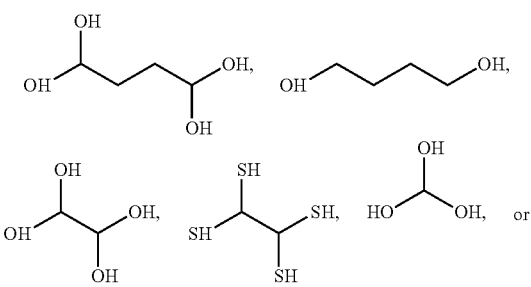

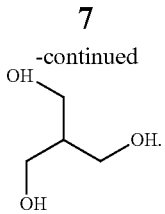

In some embodiments, a coupling reagent is added instead of the crosslinker material or in addition to the crosslinker material. The coupling reagent assists the crosslinking reaction by reacting with the groups on the hydrocarbon structure in the polymer resin before the crosslinker material, allowing for a reduction in the reaction energy of the crosslinking reaction and an increase in the rate of reaction. The bonded coupling reagent then reacts with the crosslinker material, thereby coupling the crosslinker material to the polymer resin. In some embodiments, the coupling reagent has the following structure:

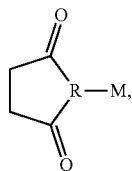

where R is a carbon atom, a nitrogen atom, a sulfur atom, or an oxygen atom; M includes a chlorine atom, a bromine atom, an iodine atom, —$NO_2$; —$SO_{3-}$; —H—; —CN; —NCO, —OCN; —$CO_{2-}$; —OH; —OR*, —OC(O)CR*; —SR, —$SO_2N(R^*)_2$; —$SO_2R^*$; SOR; —OC(O)R*; —C(O)OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

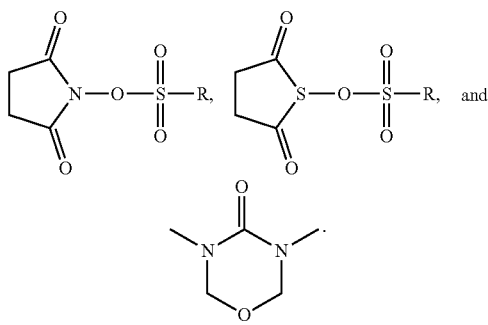

Some examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments, the photoacid generator includes a compound having a formula

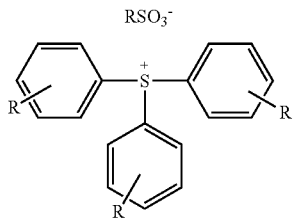

wherein R is aromatic carbon ring, or straight or cyclic alkyl, alkoxyl, or fluoro chain having 1 to 6 carbons, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group having 1 to 6 carbons, and R and R2 include —Cl; —Br; —I; —$NO_2$; —$SO_3$; —H; —CN; —NCO, —OCN; —$CO_2$; —OH; —OR*, —OC(O)CR*; —SR, —$SO_2N(R^*)_2$; —$SO_2R^*$; SOR; —OC(O)R*; —C(O)OR*; —C(O)R*; —Si(OR*)$_3$; —Si(R*)$_3$; or epoxy groups, where R* is H, an unbranched or branched, cyclic or noncyclic saturated or unsaturated alkyl or alkenyl or alkynyl group.

The photoacid generator operation is based on the following chemical equation:

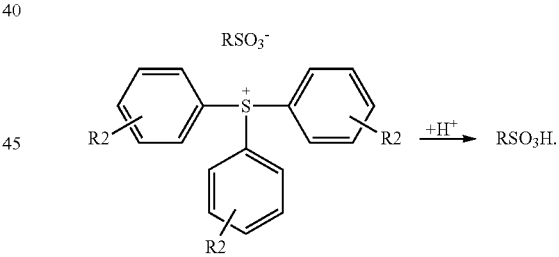

In some embodiments, the photoacid generator includes, but not limited to,

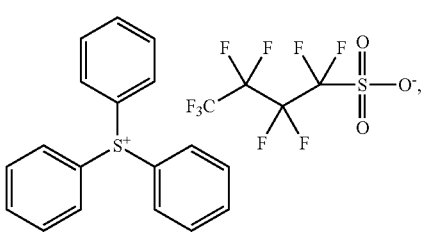

-continued

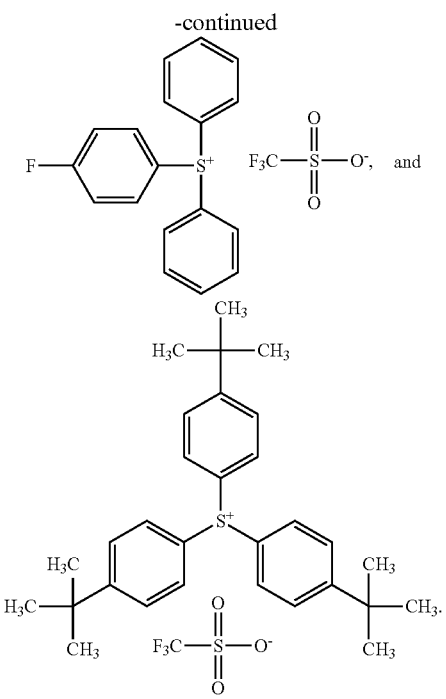

In some embodiments, the first spin-on carbon material includes an acid. In some embodiments, the suitable acid includes an organic acid selected from the group consisting of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, and combinations thereof. In some embodiments, the acid is an inorganic acid selected from the group consisting of nitric acid, sulfuric acid, hydrochloric acid, and combinations thereof.

In some embodiments, the first layer 120 includes a solvent from one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the first layer 120 includes a bottom anti-reflective coating (BARC) layer that is made of an organic material. In some embodiments, the BARC layer is made of a thermally cross-linking organic polymeric material.

In some embodiments, the first layer 120 includes at least one polymer structure, acid, quencher, chromophore, cross-linker, or solvent. The first layer 120 has different n (index of refraction), or k (extinction coefficient) values. In some embodiments, due to different first layer 120 designs that include a different chromophore or polymer component, n or k values are different.

Figure 1B:
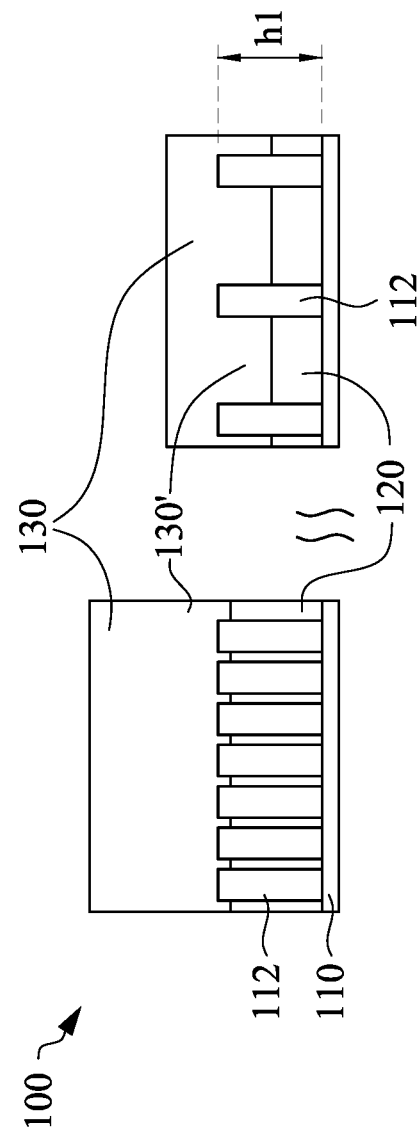

FIG. 1B illustrates the component 100 with a second layer 130 of a second spin-on carbon material that is disposed on top of the first layer 120 of the first spin-on carbon material. As shown in FIG. 1B, the combined thickness of the first layer 120 and second layer 130 is more than the full height h1 of the patterned features 112 in both of the area 114 and the area 116. However, the difference in the combined thickness of the first layer 120 and second layer 130 in the area 114 and the area 116 are still apparent.

In some embodiments, the second spin-on carbon material includes the same materials as the first spin-on carbon material without the thermal acid generator or the photoacid generator.

In some embodiments, the thickness of the second layer 130 can range from about 1 nm to about 500 nm, about 10 nm to about 400 nm, about 30 nm to about 200 nm, about 40 nm to about 100 nm, or about 50 nm to about 250 nm, inclusive of any thickness values therebetween.

In some embodiments, the first spin-on carbon material in the first layer 120 and the second spin-on carbon material in the second layer 130 undergo crosslinking reaction. In some embodiments, the crosslinking reaction occurs when an acid produced or contained in the first layer 120 diffuses into the second layer 130, thereby crosslinking the first layer 120 and second layer 130. In some embodiments, the diffusion of the acid is caused by baking at a temperature between about 90° C. and about 400° C. In some embodiments, the diffusion of the acid is caused by baking at a temperature between about 100° C. and about 380° C. In some embodiments, the baking is conducted in one or more temperature steps or operations.

Figure 1C:
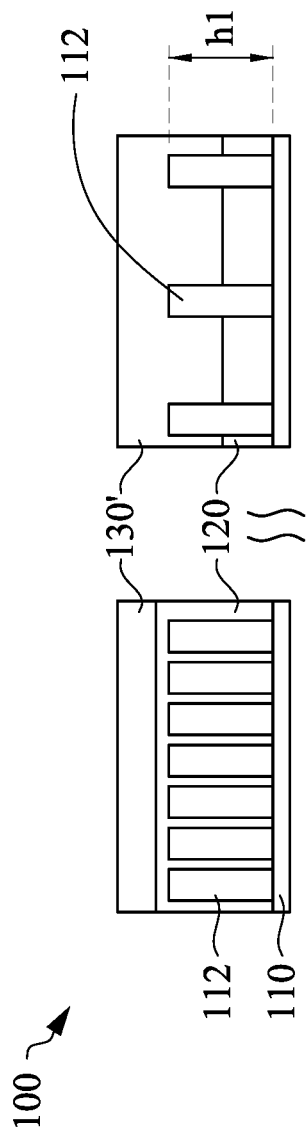

In some embodiments, the crosslinking reaction results in the formation of a combined multilayer coating that includes the first layer 120 and second layer 130. In some embodiments, the thickness of the cross-linked portion of the second layer 130 (denoted as "second layer 130'") depends on the amount of acid diffused from the first layer 120. In some embodiments, the thickness of the second layer 130' at the narrow gap area 114 is less than at the wide gap area 116 because a different amount acid has diffused out from the first layer 120. In some embodiments, a solvent rinse is used to remove non-crosslinked second spin-on carbon material. In some embodiments, the thickness of the combined multilayer coating is uniform across the different areas 114 and 116, as shown in FIG. 1C. For example, the thickness bias can be compensated using the process as described herein.

The resulting component 100, as illustrated in FIG. 1C, shows the second layer 130' of the second spin-on carbon material after a top portion of the second layer 130 is removed by the solvent rinse. As shown in FIG. 1C, after the top portion of the second layer 130 is removed, the top surfaces of the second layer 130' are substantially the same in both of the narrow gap area 114 and the wide gap area 116. In some embodiments, the high different is about 1 nm to about 50 nm. In some embodiments, the amount of TAG, PAG, or acid in the first layer 120 and/or baking conditions, such as temperature and time, are adjusted to obtain the planar surface between the narrow gap area 114 and the wide gap area 116. The amount of acid required to flatten the surfaces depends on, for example, pattern density of the narrow gap area 114 and wide gap area 116. Therefore, the removal of respective top portions in the narrow gap area 114 and wide gap area 116 results in a planar or a uniform combined first layer 120 and second layer 130' in both of the narrow gap area 114 and the wide gap area 116.

Figure 1D:
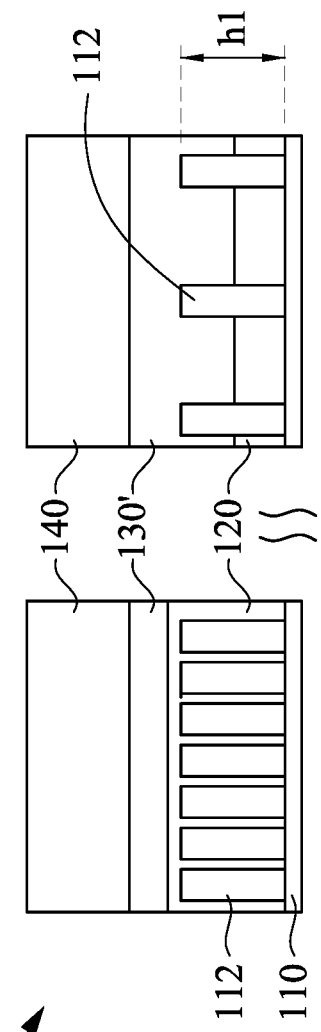

FIG. 1D illustrates the component 100 having a third layer 140 of a third spin-on carbon material is disposed on top of the second layer 130' of the second spin-on carbon material.

As shown in FIG. 1D, the combined thickness of the first layer 120, second layer 130' and third layer 140 are the same in both of the narrow gap area 114 and the wide gap area 116. Since the planarity or uniformity of the first layer 120 and second layer 130' is achieved prior to disposing of the third layer 140, the thickness of the third layer 140 can be adjusted to achieve the desired combined thickness of the multilayer coating that includes the three layers 120, 130' and 140.

In some embodiments, the third spin-on carbon material includes the same material as described with respect to the first spin-on carbon material described above. In some embodiments, the final thickness of the combined multilayer coating is achieved after the removal of the top portion of the second layer 130 that results in the planar or uniform combined thickness of the first layer 120 and second layer 130'. In some embodiments, the combined thickness of the multilayer coating is based on the combined thickness of the three layers 120, 130' and 140. In some embodiments, the third spin-on carbon material in the third layer 140 is used to adjust the final thickness of the multilayer coating.

Figure 1E:
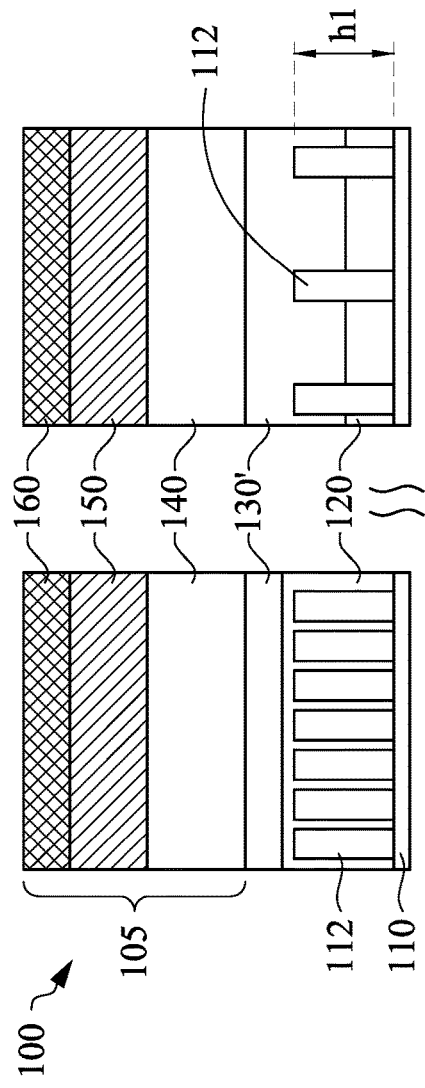
Figure 1F:
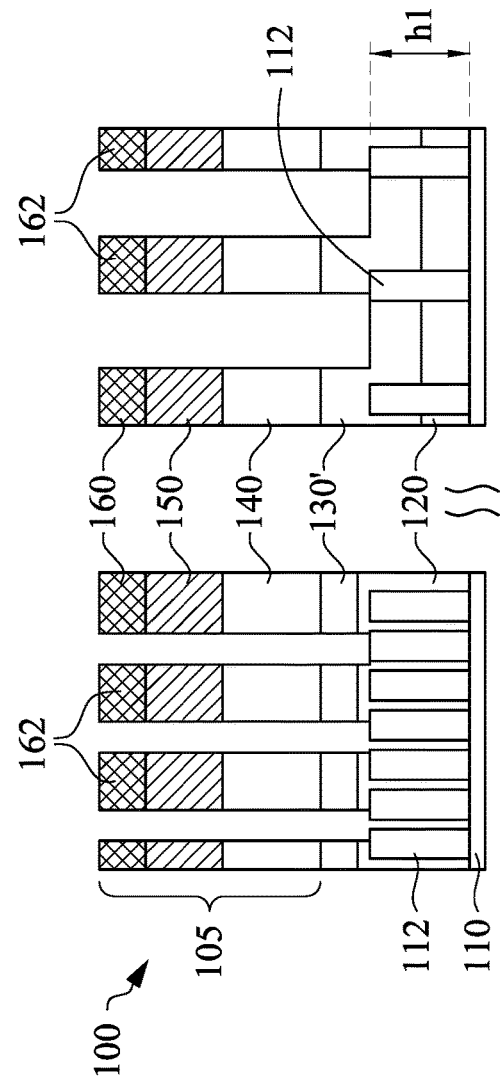

In some embodiments, the third layer 140 can also be a BARC. In some embodiments, the BARC as the third layer 140 can function as a bottom layer of a subsequent trilayer photoresist as shown in FIGS. 1E and 1F. In some embodiments, the bottom layer of the subsequent trilayer photoresist is formed by another suitable deposition process and is disposed on top of the third layer 140. In other embodiments, a single layer photoresist system is employed. In such a case, a photoresist is coated on the third layer 140 (BARC).

FIG. 1E illustrates the component 100 having a trilayer photoresist 105. As illustrated in FIG. 1E, the trilayer photoresist 105 includes the third layer 140, which is a bottom resist layer of the trilayer photoresist 105 (also referred to herein as the "bottom resist layer 140"), a middle resist layer 150 disposed on top of the bottom resist layer 140, and an upper resist layer 160 that is disposed on top of the middle resist layer 150. In some embodiments, the bottom resist layer 140 is an organic material having a substantially planar upper surface, the middle resist layer 150 is an anti-reflective layer, and the upper resist layer 160 is a photoresist. The photoresist upper resist layer 160 is patterned using suitable photolithographic operations.

In some embodiments, the bottom resist layer 140 includes organic materials. The organic materials may include a plurality of monomers or polymers that are not cross-linked. In some embodiments, the bottom resist layer 140 contains a material that is patternable and/or have a composition tuned to provide anti-reflection properties. Some exemplary materials for the bottom resist layer 140 include carbon backbone polymers. In some embodiments, the thickness of the bottom resist layer 140 ranges from about 10 nm to about 500 nm, or about 50 nm to about 400 nm, inclusive of thickness values therebetween. In some embodiments, the third layer 140 is omitted, and the second layer 130' functions as the bottom resist layer of the trilayer photoresist 105.

The middle resist layer 150 of the trilayer photoresist 105 may have a composition that provides anti-reflective properties for the photolithography operation and/or hard mask properties. In some embodiments, the middle resist layer 150 includes a silicon containing layer (e.g., a silicon hard mask material). The middle resist layer 150 may include a silicon-containing inorganic polymer. In some embodiments, the middle resist layer 150 includes a siloxane polymer. In some embodiments, the middle resist layer 150 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle resist layer 150 may be bonded to adjacent layers, such as by covalent bonding, hydrogen bonding, or hydrophilic-to-hydrophilic forces.

In some embodiments, the middle resist layer 150 includes a composition that allows for a covalent bond to be formed between the middle layer and the overlying middle resist layer 150 after an exposure process and/or subsequent baking process. In some embodiments, the middle resist layer 150 includes an additive compound or component having a photo base generator (PBG). This PBG generates a base that interacts with the exposed photoresist and provides for covalent bonding between the middle layer and a component of the overlying photoresist. In some embodiments, the middle resist layer 150 includes a siloxane polymer and a PBG.

Some exemplary photo-base generators include components that generate amines and sulfur (sulfur ions $S^{-2}$) bases. In some embodiments, the PBGs include, but not limited to, carbamates, O-acyloximes, ammonium salts, amineimides, α-aminoketones, amidine precursors, aromatic ureas, and trimethylbenzhydrylammonium iodide.

The middle resist layer 150 may be formed by a spin-on coating process, chemical vapor deposition process (CVD), physical vapor deposition (PVD) process, and/or other suitable deposition processes. In some embodiments, the thickness of the middle resist layer 150 ranges from about 10 nm to about 100 nm, or about 20 nm to about 80 nm, inclusive of thickness values therebetween.

In some embodiments, the upper resist layer 160 is a photosensitive layer which can be patterned by actinic radiation, as known in the art. The chemical properties of the photoresist regions struck by incident radiation change in a manner that depends on the type of photoresist used. In some embodiments, the upper resist layer 160 is a positive resist. Positive resist refers to a photoresist material that when exposed to radiation, such as UV light, becomes soluble in a developer, while the portion of the photoresist that is non-exposed (or exposed less) is insoluble in the developer. In some embodiments, the upper resist layer 160 is a negative resist. Negative resist refers a photoresist material that when exposed to radiation becomes insoluble in the developer, while the portion of the photoresist that is non-exposed is soluble in the developer.

The upper resist layer 160 may include a carbon backbone polymer, and other suitable components such as a solvent and/or photo acid generators. For example, in some embodiments, the upper resist layer 160 is a chemical amplified resist. In some embodiments, the thickness of the upper resist layer 160 ranges from about 10 nm to about 400 nm, or about 50 nm to about 300 nm, inclusive of thickness values therebetween.

In some embodiments, after coating, a soft bake process is performed on the upper resist layer 160. The upper resist layer 160 is subsequently exposed to actinic radiation in a patternwise manner thereby forming a latent image in the upper resist layer 160. The actinic radiation may be generated by a lithography system that provides a pattern of the radiation according to an integrated circuit design layout. In some embodiments, a lithography system includes ultraviolet (UV) radiation, deep ultraviolet (DUV) radiation, extreme ultraviolet (EUV) radiation, X-ray radiation, and/or other suitable radiation types. In alternative embodiments, a lithography system includes a charged particle lithography system, such as an electron beam or an ion beam lithography system.

In some embodiments, after the exposure operation, a hard baking operation occurs. The exposed upper resist layer 160 is subsequently developed to form a pattern by applying a developer to the exposed upper resist layer 160. The developer is a solvent, and may be sprayed on the exposed photoresist film.

FIG. 1F illustrates the component 100 after developing the pattered features 162 in the trilayer photoresist 105. As shown in FIG. 1F, the patterned features 162 are transferred and extended to the underlying middle resist layer 150 and bottom resist layer 140 of the trilayer photoresist 105, using suitable etching operations.

It is understood that the component 100 undergoes further processes, including material deposition, implantation, or etching operations, to form various features such as field effect transistors, cap insulating layers, contacts/vias, silicide layers, interconnect metal layers, dielectric layers, passivation layers, metallization layers with signal lines, etc. In some embodiments, one or more layers of conductive, semiconductive, and insulating materials are formed over the component 100, and additional patterns may be formed in one or more of the layers for further processing.

Figure 2:
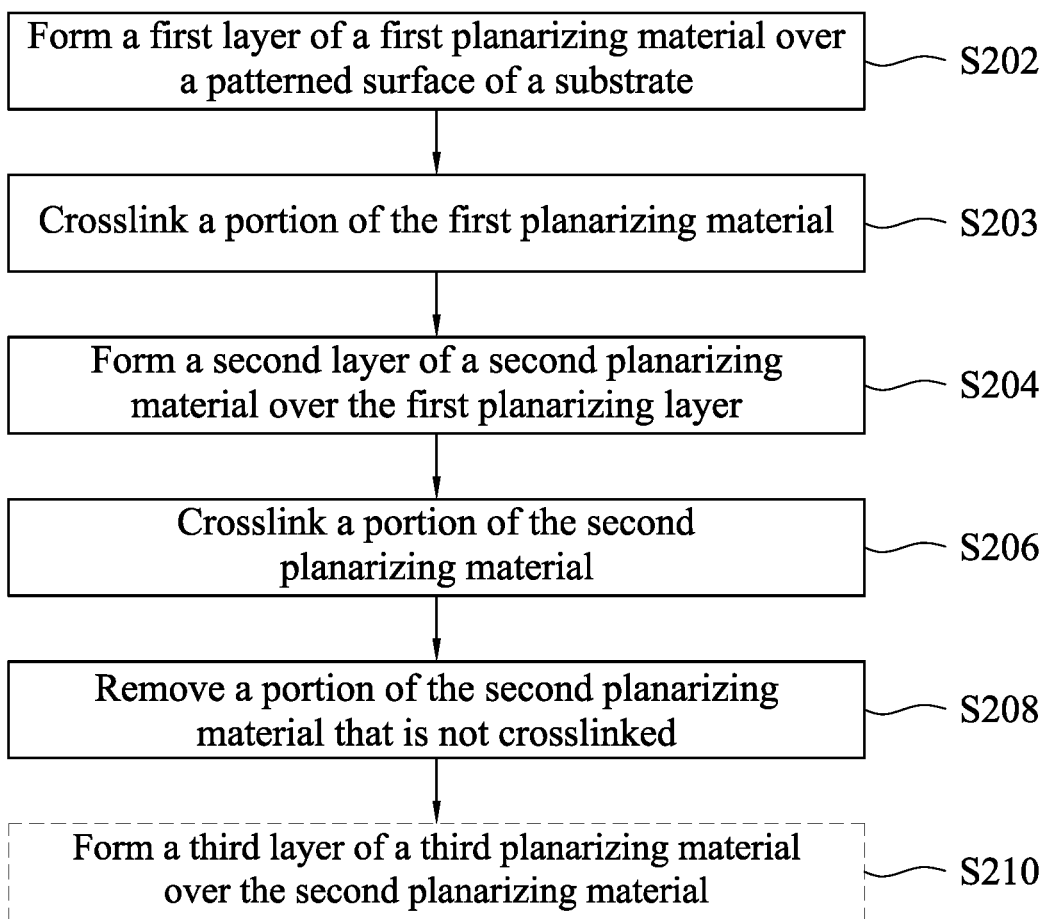
FIG. 2 is a flow chart illustrating a method of manufacturing a semiconductor device, according to an embodiment of the disclosure.

FIG. 2 is a flow chart illustrating a method 200 of manufacturing a semiconductor device, according to an embodiment of the disclosure. As shown in FIG. 2, the method 200 includes forming a first layer of a first planarizing material over a patterned surface of a substrate at operation S202. In some embodiments, the substrate is any substrate as described with respect to FIGS. 1A-1F. In some embodiments, the first planarizing material includes any material as described with respect to the first layer 120 in FIGS. 1A-1F. In some embodiments, the patterned surface include a surface having a wide range of gaps.

In some embodiments, the first planarizing material includes, for example, but not limited to, a spin-on carbon and an acid or an acid generator, including for example, but not limited to thermal acid generator (TAG), photoacid generator (PAG) or acid with a pH of less than 7. In some embodiments, the thermal acid generator includes any of the TAG materials as described with respect to FIGS. 1A-1F. In some embodiments, the photoacid generator includes any of the PAG materials as described with respect to FIGS. 1A-1F. In some embodiments, the acid includes any of the acids as described with respect to FIGS. 1A-1F.

Due to the gap size differences, the surface level of the first planarizing material is different in the areas with wide gaps and the areas with narrow gaps, as illustrated in FIG. 1A. This is due to the amount of first spin-on carbon material that is accumulated within the gaps of the patterned features. The top surface level of the first planarizing material is to be maintained at below a maximum height of the patterned features, in some embodiments.

At operation S203, the method 200 includes crosslinking a portion of the first planarizing material. In some embodiments, the crosslinking a portion of the first planarizing material includes diffusing an acid from the first layer at a temperature ranging from about 90° C. to about 400° C. In some embodiments, the first planarizing material includes a thermal acid generator and the acid is generated by heating the first layer at a temperature ranging from about 90° C. to about 400° C. In some embodiments, the first planarizing material includes a photoacid generator and the acid is generated by irradiating the first planarizing layer with actinic radiation.

In operation S204, the method 200 includes forming a second layer of a second planarizing material over the first planarizing layer. The second planarizing material is the same as the first planarizing material without the acid, thermal acid generator, or the photoacid generator when formed, in some embodiments. In some embodiments, the second planarizing material comprises a spin-on carbon.

At operation S206, the method 200 includes crosslinking a portion of the second planarizing material. In some embodiments, the crosslinking a portion of the second planarizing material includes diffusing an acid from the first layer to the second layer. In some embodiments, the acid is diffused from the first layer to the second layer by heating the first and second layers at a temperature ranging from about 90° C. to about 400° C. In some embodiments, the first planarizing material includes a thermal acid generator and the acid is generated by heating the first layer at a temperature ranging from about 90° C. to about 400° C. In some embodiments, the first planarizing material includes a photoacid generator and the acid is generated by irradiating the first planarizing layer with actinic radiation.

In some embodiments, the crosslinking results in the formation of a combined multilayer coating that includes the first planarizing material and the second planarizing material. In some embodiments, the thickness of the combined multilayer coating depends on the amount of acid that diffuses from the first planarizing material.

At operation S208, the method 200 includes removing a portion of the second planarizing material that is not crosslinked. In some embodiments, the thickness of the combined multilayer coating is uniform across different areas of the patterned surface (see FIG. 1C). In some embodiments, the final thickness of the combined multilayer coating is achieved after the operation S208 of removing the non-crosslinked second planarizing material.

At operation S210, the method 200 optionally includes forming a third layer of a third planarizing material over the second planarizing material after removing the portion of the second planarizing material that is not crosslinked. In some embodiments, the third planarizing material includes anti-reflective coating (BARC). In some embodiments, the third planarizing material includes spin-on carbon, an acid or an acid generator.

Figure 3:
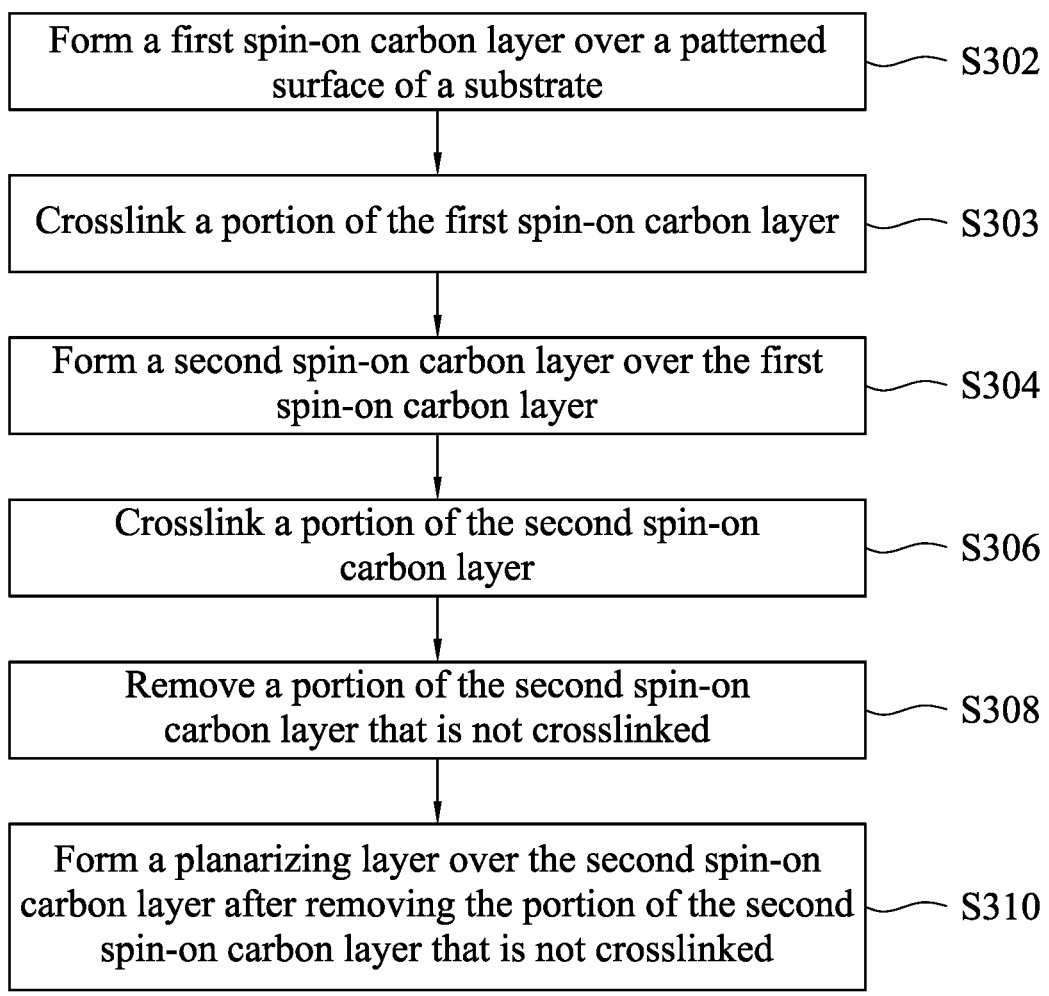
FIG. 3 is another flow chart illustrating a method of manufacturing a semiconductor device, according to an embodiment of the disclosure.

FIG. 3 is another flow chart illustrating a method 300 of manufacturing a semiconductor device, according to an embodiment of the disclosure. As shown in FIG. 3, the method 300 includes forming a first spin-on carbon layer over a patterned surface of a substrate at operation S302. In some embodiments, the substrate is any substrate as described with respect to FIGS. 1A-1F. In some embodiments, the first spin-on carbon layer includes any materials described with respect to the first layer 120 in FIGS. 1A-1F. In some embodiments, the patterned surface include a surface having a wide range of gaps.

In some embodiments, the first spin-on carbon layer includes, for example, but not limited to, a spin-on carbon and an acid or an acid generator, including for example, but not limited to thermal acid generator (TAG), photoacid generator (PAG) or acid with a pH of less than 7. In some embodiments, the thermal acid generator includes any of the TAG materials as described with respect to FIGS. 1A-1F. In some embodiments, the photoacid generator includes any of the PAG materials as described with respect to FIGS. 1A-1F. In some embodiments, the acid includes any of the acids as described with respect to FIGS. 1A-1F.

At operation S303, the method 300 includes crosslinking a portion of the first spin-on carbon layer. In some embodiments, the crosslinking a portion of the first spin-on carbon layer includes diffusing an acid from the first spin-on carbon layer at a temperature ranging from about 90° C. to about 400° C. In some embodiments, the first spin-on carbon layer includes a thermal acid generator and the acid is generated by heating the first spin-on carbon layer at a temperature ranging from about 90° C. to about 400° C. In some embodiments, the first spin-on carbon layer includes a photoacid generator and the acid is generated by irradiating the first spin-on carbon layer with actinic radiation.

In operation S304, the method 300 includes forming a second spin-on carbon layer over the first spin-on carbon layer. The second spin-on carbon layer is the same as the first spin-on carbon layer without the acid, thermal acid generator, or the photoacid generator when formed, in some embodiments. In some embodiments, the second spin-on carbon layer includes a spin-on carbon.

At operation S306, the method 300 includes crosslinking a portion of the second spin-on carbon layer. In some embodiments, the crosslinking a portion of the second spin-on carbon layer includes diffusing an acid from the first layer to the second layer. In some embodiments, the acid is diffused from the first layer to the second layer by heating the first and second layers at a temperature ranging from about 90° C. to about 400° C. In some embodiments, the first spin-on carbon layer includes a thermal acid generator and the acid is generated by heating the first layer at a temperature ranging from about 90° C. to about 400° C. In some embodiments, the first spin-on carbon layer includes a photoacid generator and the acid is generated by irradiating the first spin-on carbon layer with actinic radiation.

In some embodiments, the crosslinking results in the formation of a combined multilayer coating that includes the first spin-on carbon layer and the second spin-on carbon layer. In some embodiments, the thickness of the combined multilayer coating depends on the amount of acid that diffuses from the first spin-on carbon layer.

At operation S308, the method 300 includes removing a portion of the second spin-on carbon layer that is not crosslinked. In some embodiments, the thickness of the combined multilayer coating is uniform across different areas of the patterned surface (see FIG. 1C). In some embodiments, the final thickness of the combined multilayer coating is achieved after the operation S308 of removing the non-crosslinked second spin-on carbon layer.

At operation S310, the method 300 includes forming a planarizing layer over the second spin-on carbon layer after removing the portion of the second spin-on carbon layer that is not crosslinked. In some embodiments, the first spin-on carbon layer includes an acid, a thermal acid generator, or a photoacid generator when the first spin-on carbon layear is formed, and the second spin-on carbon layer does not include an acid, a thermal acid generator, or a photoacid generator when the second spin-on carbon layer is formed.

Figure 4:
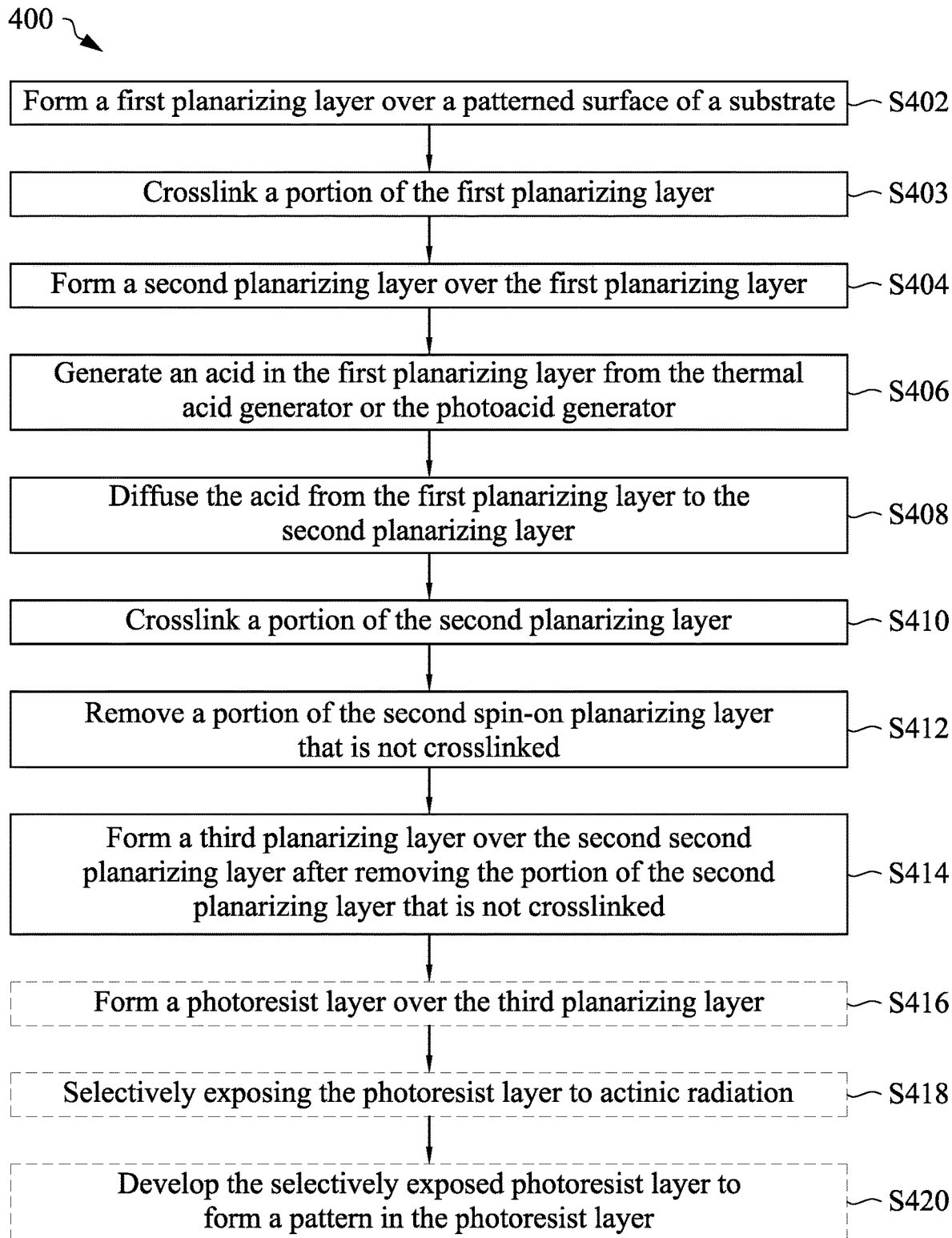
FIG. 4 is another flow chart illustrating a method of manufacturing a semiconductor device, according to an embodiment of the disclosure.

FIG. 4 is another flow chart illustrating a method 400 of manufacturing a semiconductor device, according to an embodiment of the disclosure. As shown in FIG. 4, the method 400 includes forming a first planarizing layer over a patterned surface of a substrate at operation S402. In some embodiments, the first planarizing layer includes a spin-on carbon and a thermal acid generator or a photoacid generator.

At operation S403, the method 400 includes crosslinking a portion of the first planarizing layer. In some embodiments, the crosslinking a portion of the first planarizing layer includes diffusing an acid from the first planarizing layer at a temperature ranging from about 90° C. to about 400° C. In some embodiments, the first planarizing layer includes a thermal acid generator and the acid is generated by heating the first spin-on carbon layer at a temperature ranging from about 90° C. to about 400° C. In some embodiments, the first planarizing layer includes a photoacid generator and the acid is generated by irradiating the first spin-on carbon layer with actinic radiation.

In operation S404, the method 400 includes forming a second planarizing layer over the first planarizing layer. The second planarizing layer includes a spin-on carbon, and the second planarizing layer does not include a thermal acid generator or a photoacid generator.

At operation S406, the method 400 includes generating an acid in the first planarizing layer from the thermal acid generator or the photoacid generator.

At operation S408, the method 400 includes diffusing the acid from the first planarizing layer to the second planarizing layer.

At operation S410, the method 400 includes crosslinking a portion of the second planarizing layer.

At operation S412, the method 400 includes removing a portion of the second spin-on planarizing layer that is not crosslinked.

At operation S414, the method 400 includes forming a third planarizing layer over the second second planarizing layer after removing the portion of the second planarizing layer that is not crosslinked.

At operation S416, the method 400 optionally includes forming a photoresist layer over the third planarizing layer.

At operation S418, the method 400 optionally includes selectively exposing the photoresist layer to actinic radiation.

At operation S420, the method 400 optionally includes developing the selectively exposed photoresist layer to form a pattern in the photoresist layer.

Figure 5:
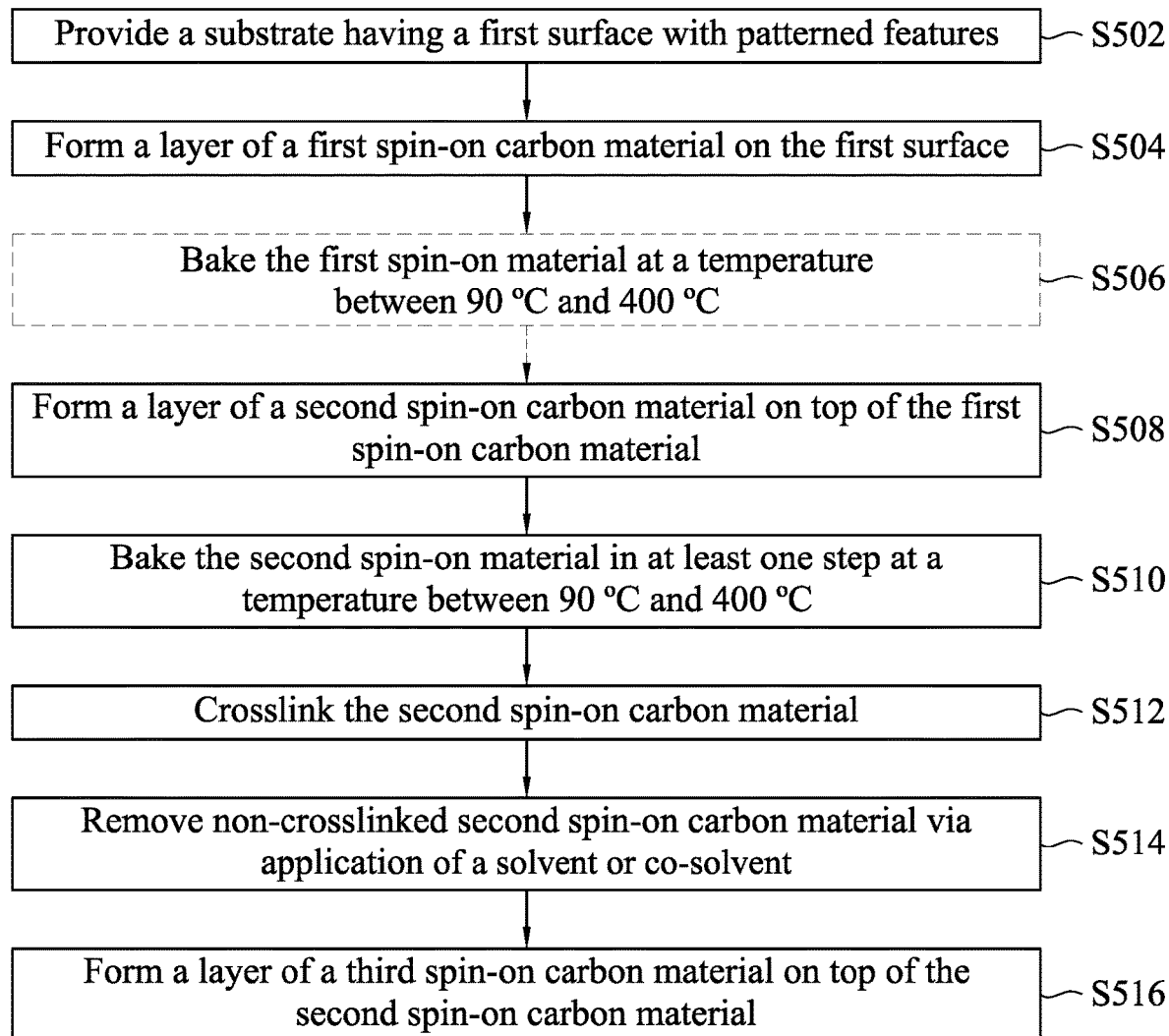
FIG. 5 is another flow chart illustrating a method of manufacturing a semiconductor device, according to an embodiment of the disclosure.

FIG. 5 is another flow chart illustrating another method 500 of forming a multilayer spin-on carbon coating, according to an embodiment of the disclosure. As shown in FIG. 5, the method 500 includes providing a substrate having a first surface with patterned features at operation S502. In some embodiments, the substrate is a semiconductor substrate, or includes a single crystalline semiconductor layer on at least its surface, or include a single crystalline semiconductor material such as, but not limited to Si, Ge, SiGe, GaAs, InSb, GaP, GaSb, InAlAs, InGaAs, GaSbP, GaAsSb, and InP. In some embodiments, the substrate is a semiconductor wafer. In some embodiments, the patterned features include a wide range of gaps.

In operation S504, the method 500 includes forming a layer of a first spin-on carbon material on the first surface with patterned features. In some embodiments, the first spin-on carbon material includes, for example, but not limited to, thermal acid generator (TAG), photoacid generator (PAG) or acid with a pH of less than 7. In some embodiments, the thermal acid generator includes a formula $CF_3—R—CF_2SO_3^-(R^1)_4N^+$, where R is a straight chain or a cyclic alkyl, alkoxyl or fluoro chain having 1 to 6 carbons, or a cyclic alkene, alkyne, hydroxyl, ketone, aldehyde, carbonate, carboxylic acid, or aryl, and $R^1$ is hydrogen, an alkyl, a bond, or a ring with N.

In some embodiments, the photoacid generator includes a formula

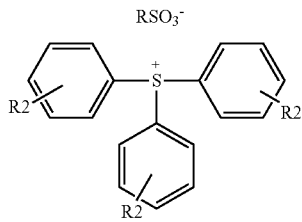

wherein R is aromatic carbon ring, or straight or cyclic alkyl, alkoxyl, or fluoro chain having 1 to 6 carbons, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group having 1 to 6 carbons, and R and R2 include —Cl; —Br; —I; —NO$_2$; —SO$_3$; —H; —CN; —NCO, —OCN; —CO$_2$; —OH; —OR*; —OC(O)CR*; —SR, —SO$_2$N(R*)$_2$; —SO$_2$R*; SOR; —OC(O)R*; —C(O)OR*; —C(O)R*; —Si(OR*)$_3$; —Si(R*)$_3$; or epoxyl groups, where R* is H, an unbranched or branched, cyclic or noncyclic saturated or unsaturated alkyl or alkenyl or alkynyl group.

Due to the gap size differences, the surface level of the first spin-on carbon material is different in the areas with wide gaps and the areas with narrow gaps, as illustrated in FIG. 1A. This is due to the amount of first spin-on carbon material that is accumulated within the gaps of the patterned features. The top surface level of the first spin-on carbon material is to be maintained at below a maximum height of the patterned features, in some embodiments.

At operation S506, the method 500 optionally includes baking the first spin-on carbon material at a temperature between about 90° C. and about 400° C. Baking at a temperature of between about 90° C. and about 400° C. activates the first spin-on carbon material by releasing an acid and crosslinking the first spin-on carbon material. For example, the thermal acid generator material releases an acid when it is baked to a temperature about 90° C. and about 400° C., in some embodiments.

The method 500 further includes forming a layer of a second spin-on carbon material on top of the first spin-on carbon material, at operation S508. The second spin-on carbon material is the same as the first spin-on carbon material without the thermal acid generator or the photoacid generator.

The method 500 further includes baking the layer of the second spin-on carbon material in at least one step at a temperature between about 90° C. and about 400° C. after forming the layer of the second spin-on carbon material, at operation S510. In some embodiments, the baking is conducted in one or more temperature operations at a temperature between about 90° C. and about 400° C.

The method 500 further includes crosslinking the second spin-on carbon material, at operation S512. The crosslinking results in the formation of a combined multilayer coating that includes the first spin-on carbon material and the second spin-on carbon material. In some embodiments, the thickness of the combined multilayer coating depends on the amount of acid that diffuses from the first spin-on carbon material.

The method 500 further includes removing the non-crosslinked second spin-on carbon material via the application of a solvent, at operation S514. In some embodiments, the thickness of the combined multilayer coating is uniform across different areas of the patterned features (see FIG. 1C). In some embodiments, the final thickness of the combined multilayer coating is achieved after the operation S514 of removing the non-crosslinked spin-on carbon material.

The method 500 further includes forming a layer of a third spin-on carbon material on top of the second spin-on carbon material, at operation S516. The operation S516 of forming the third layer allows the desired thickness of the multilayer coating to be achieved by adding the additional third spin-on carbon material, in some embodiments. In some embodiments, the third spin-on carbon material includes the same material as described with respect to the first spin-on carbon material described above.

It is understood that the semiconductor devices formed according to the disclosed methods undergo further processes, including material deposition, implantation, or etching operations, to form various features such as field effect transistors, cap insulating layers, contacts/vias, silicide layers, interconnect metal layers, dielectric layers, passivation layers, metallization layers with signal lines, etc. In some embodiments, one or more layers of conductive, semiconductive, and insulating materials are formed over the substrate, and a pattern is formed in one or more of the layers.

The methods of manufacturing a semiconductor device as described herein allow for forming of a planar or uniform multilayer coating during manufacturing of the semiconductor device, without altering current processes and operations. The disclosed methods can drastically improve planarity and/or uniformity of coatings in current semiconductor processes, without prohibitive costs and/or integration penalty into existing process flows.

An embodiment of the disclosure is a method of manufacturing a semiconductor device. The method includes forming a first layer of a first planarizing material over a patterned surface of a substrate, crosslinking a portion of the first planarizing material, forming a second layer of a second planarizing material over the first planarizing layer, crosslinking a portion of the second planarizing material, and removing a portion of the second planarizing material that is not crosslinked. In an embodiment, the method further includes forming a third layer of a third planarizing material over the second planarizing material after removing the portion of the second planarizing material that is not crosslinked. In an embodiment, the third planarizing material includes a bottom anti-reflective coating (BARC). In an embodiment, the third planarizing material includes a spin-on carbon. In an embodiment, the third planarizing material includes an acid or an acid generator. In an embodiment, the first planarizing material includes a spin-on carbon and an acid or an acid generator. In an embodiment, the acid generator is a thermal acid generator or a photoacid generator. In an embodiment, the thermal acid generator includes a formula CF$_3$—R—CF$_2$SO$_3^-$(R$^1$)$_4$N$^+$, where R is a straight chain or a cyclic alkyl, alkoxyl or fluoro chain having 1 to 6 carbons, or a cyclic alkene, alkyne, hydroxyl, ketone, aldehyde, carbonate, carboxylic acid, or aryl, and R1 is hydrogen, an alkyl, a bond, or a ring with N. In an embodiment, the photoacid generator includes a formula

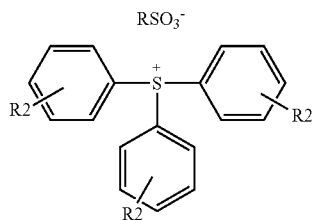

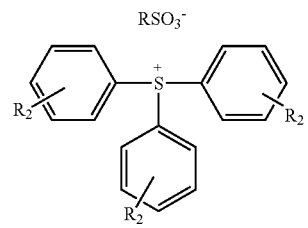

wherein R is aromatic carbon ring, or straight or cyclic alkyl, alkoxyl, or fluoro chain having 1 to 6 carbons, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group having 1 to 6 carbons, and R and R2 comprise —Cl; —Br; —I; —$NO_2$; —$SO_3$; —H; —CN; —NCO, —OCN; —$CO_2$; —OH; —OR*; —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; or epoxyl groups, where R* is H, an unbranched or branched, cyclic or noncyclic saturated or unsaturated alkyl or alkenyl or alkynyl group, and a is 1-20. In an embodiment, the crosslinking a portion of the second planarizing material includes diffusing an acid from the first layer to the second layer. In an embodiment, the acid is diffused from the first layer to the second layer by heating the first and second layers at a temperature ranging from about 90° C. to about 400° C. In an embodiment, the first planarizing material includes a thermal acid generator and the acid is generated by the heating the first layer at a temperature ranging from about 90° C. to about 400° C. In an embodiment, the first planarizing material includes a photoacid generator and the acid is generated by irradiating the first planarizing layer with actinic radiation. In an embodiment, the second planarizing material includes a spin-on carbon. In an embodiment, the second planarizing material does not contain an acid or an acid generator when forming the second layer.

Another embodiment of the disclosure is a method of manufacturing a semiconductor device. The method includes, forming a first spin-on carbon layer over a patterned surface of a substrate, crosslinking a portion of the first spin-on carbon layer, forming a second spin-on carbon layer over the first spin-on carbon layer, crosslinking a portion of the second spin-on carbon layer, removing a portion of the second spin-on carbon layer that is not crosslinked, and forming a planarizing layer over the second spin-on carbon layer after removing the portion of the second spin-on carbon layer that is not crosslinked. In an embodiment, the first spin-on carbon layer includes an acid, a thermal acid generator, or a photoacid generator when the first spin-on carbon layer is formed, and the second spin-on carbon layer does not include the acid, the thermal acid generator, or the photoacid generator when the second spin-on carbon layer is formed. In an embodiment, the thermal acid generator includes a formula $CF_3$—R—$CF_2SO_3^-(R^1)_4N^+$, where R is a straight chain or a cyclic alkyl, alkoxyl or fluoro chain having 1 to 6 carbons, or a cyclic alkene, alkyne, hydroxyl, ketone, aldehyde, carbonate, carboxylic acid, or aryl, and R1 is hydrogen, an alkyl, a bond, or a ring with N, and the photoacid generator includes a formula wherein R is aromatic carbon ring, or straight or cyclic alkyl, alkoxyl, or fluoro chain having 1 to 6 carbons, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group having 1 to 6 carbons, and R and R2 comprise —Cl; —Br; —I; —$NO_2$; —$SO_3$; —H; —CN; —NCO, —OCN; —$CO_2$; —OH; —OR*; —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; or epoxyl groups, where R* is H, an unbranched or branched, cyclic or noncyclic saturated or unsaturated alkyl or alkenyl or alkynyl group.

Another embodiment of the disclosure is a method of manufacturing a semiconductor device. The method includes forming a first planarizing layer over a patterned surface of a substrate, wherein the first planarizing layer includes a spin-on carbon and a thermal acid generator or a photoacid generator, crosslinking a portion of the first planarizing layer, forming a second planarizing layer over the first planarizing layer, wherein the second planarizing layer includes a spin-on carbon, and the second planarizing layer does not include a thermal acid generator or a photoacid generator, generating an acid in the first planarizing layer from the thermal acid generator or the photoacid generator, diffusing the acid from the first planarizing layer to the second planarizing layer, crosslinking a portion of the second spin-on planarizing layer, removing a portion of the second spin-on planarizing layer that is not crosslinked, and forming a third planarizing layer over the second second planarizing layer after removing the portion of the second planarizing layer that is not crosslinked. In an embodiment, the method further includes forming a photoresist layer over the third planarizing layer, selectively exposing the photoresist layer to actinic radiation, and developing the selectively exposed photoresist layer to form a pattern in the photoresist layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first layer of a first planarizing material over a patterned surface of a substrate;
    forming a second layer of a second planarizing material over the first layer;

crosslinking a portion of the first layer and a portion of the second layer by causing production of an acid in the first layer and diffusion of the acid into the second layer; and removing a portion of the second layer that is not crosslinked.

2. The method according to claim 1, further comprising forming a third layer of a third planarizing material over the second planarizing material after removing the portion of the second planarizing material that is not crosslinked.

3. The method according to claim 2, wherein the third planarizing material comprises a bottom anti-reflective coating (BARC).

4. The method according to claim 2, wherein the third planarizing material comprises a spin-on carbon.

5. The method according to claim 1, wherein the first planarizing material comprises a thermal acid generator.

6. The method according to claim 5, wherein the thermal acid generator includes a compound having a formula $CF_3$—$R$—$CF_2SO_3^{31}$ $(R^1)_4N^+$, wherein R is a straight chain or a cyclic alkyl, alkoxyl, or fluoro group having 1 to 6 carbons, a cyclic alkene group, an alkyne group, a hydroxyl, a ketone, a carbonate, a carboxylic acid, or an aryl group, and $R^1$ is hydrogen, an alkyl group, a bond, or a ring including N.

7. A method of manufacturing a semiconductor device, comprising:
forming a first spin-on carbon layer over a patterned surface of a substrate;
forming a second spin-on carbon layer over the first spin-on carbon layer;
crosslinking a portion of the first spin-on carbon layer and a portion of the second spin-on carbon layer by causing production of an acid in the first spin-on carbon layer and diffusion of the acid into the second spin-on carbon layer;
removing a portion of the second spin-on carbon layer that is not crosslinked; and
forming a planarizing layer over the second spin-on carbon layer after removing the portion of the second spin-on carbon layer that is not crosslinked.

8. The method according to claim 7, wherein the causing the production of the acid comprises heating the first spin-on carbon layer at a temperature ranging from 90° C. to 400° C.

9. The method according to claim 7, wherein the first spin-on carbon layer comprises a thermal acid generator.

10. The method according to claim 9, wherein the thermal acid generator includes a compound having a formula $CF_3$—$R$—$CF_2SO_3^{31}$ $(R^1)_4N^+$, wherein R is a straight chain or a cyclic alkyl, alkoxyl, or fluoro group having 1 to 6 carbons, a cyclic alkene group, an alkyne group, a hydroxyl, a ketone, a carbonate, a carboxylic acid, or an aryl group, and $R^1$ is hydrogen, an alkyl group, a bond, or a ring including N.

11. The method according to claim 7, wherein the second spin-on carbon layer does not include an acid or an acid generator when the second spin-on carbon layer is formed.

12. The method according to claim 7, wherein the crosslinking forms a combined multilayer coating including the first spin-on carbon layer and the second spin-on carbon layer.

13. The method according to claim 12, wherein a thickness of the combined multilayer coating depends on an amount of acid that diffuses from the first spin-on carbon layer.

14. A method of manufacturing a semiconductor device, comprising:
forming a first planarizing layer over a patterned surface of a substrate, wherein the first planarizing layer comprises a spin-on carbon;
forming a second planarizing layer over the first planarizing layer, wherein the second planarizing layer comprises a spin-on carbon;
crosslinking a portion of the first planarizing layer and a portion of the second planarizing layer by causing production of an acid in the first planarizing layer and diffusion of the acid into the second planarizing layer;
removing a portion of the second planarizing layer that is not crosslinked; and
forming a third planarizing layer over the second planarizing layer after removing the portion of the second planarizing layer that is not crosslinked.

15. The method according to claim 14, further comprising forming a photoresist layer over the third planarizing layer.

16. The method according to claim 15, further comprising selectively exposing the photoresist layer to actinic radiation.

17. The method according to claim 16, further comprising developing the selectively exposed photoresist layer to form a pattern in the photoresist layer.

18. The method according to claim 14, wherein the first planarizing layer further comprises a thermal acid generator.

19. The method according to claim 18, wherein the thermal acid generator includes a compound having a formula $CF_3$—$R$—$CF_2SO_3^{31}$ $(R^1)_4N^+$, wherein R is a straight chain or a cyclic alkyl, alkoxyl, or fluoro group having 1 to 6 carbons, a cyclic alkene group, an alkyne group, a hydroxyl, a ketone, a carbonate, a carboxylic acid, or an aryl group, and $R^1$ is hydrogen, an alkyl group, a bond, or a ring including N.

20. The method according to claim 14, wherein the causing the production of the acid comprises heating the first planarizing layer at a temperature ranging from 90° C. to 400° C.

* * * * *